(12) United States Patent
Pratt et al.

(10) Patent No.: US 8,999,498 B2
(45) Date of Patent: *Apr. 7, 2015

(54) METHODS AND SYSTEMS FOR RELEASABLY ATTACHING SUPPORT MEMBERS TO MICROFEATURE WORKPIECES (71) Applicant: Micron Technology, Inc., Boise, ID (US)

(72) Inventors: David Pratt, Meridian, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/751,671

(22) Filed: Jan. 28, 2013

(65) Prior Publication Data

US 2013/0136898 A1    May 30, 2013

Related U.S. Application Data (60) Continuation of application No. 12/795,474, filed on Jun. 7, 2010, now Pat. No. 8,361,604, which is a division of application No. 11/374,750, filed on Mar. 14, 2006, now Pat. No. 7,749,349.

(51) Int. Cl.
*B32B 3/10* (2006.01)
*B32B 3/22* (2006.01)
(Continued)

(52) U.S. Cl.
CPC .............. *H05K 13/0023* (2013.01); *B32B 7/14* (2013.01); *B23B 7/02* (2013.01); *B32B 3/30* (2013.01); *H01L 21/78* (2013.01); *B32B 37/1292* (2013.01); *B32B 37/144* (2013.01)

(58) Field of Classification Search
None
See application file for complete search history.

(56) References Cited

U.S. PATENT DOCUMENTS 3,681,139 A   8/1972 Jannett et al.
3,809,050 A   5/1974 Chough et al.
(Continued)

FOREIGN PATENT DOCUMENTS

EP         1041624 A1    10/2000
JP      2003218073 A     7/2003

OTHER PUBLICATIONS

Staystik® Thermoplastic Adhesives, Application Bulletin, Bulletin #6. Cookson Electronics, Mar. 1, 2001, Retrieved from the Internet: <URL http://www.cooksonsemi.com/pdfs/STAYSTIK%20Appl%20Bull-Wafer_2002.pdf>.

(Continued)

*Primary Examiner* — Aaron Austin
*Assistant Examiner* — Jeff Vonch
(74) *Attorney, Agent, or Firm* — Perkins Coie LLP (57) ABSTRACT

Methods and apparatuses for releasably attaching support members to microfeature workpieces to support members are disclosed herein. In one embodiment, for example, a method for processing a microfeature workpiece including a plurality of microelectronic dies comprises forming discrete blocks of material at a first side of a support member. The blocks are arranged on the support member in a predetermined pattern. The method also includes depositing an adhesive material into gaps between the individual blocks of material and placing a first side of the workpiece in contact with the adhesive material and/or the blocks. The method further includes cutting through a second side of the workpiece to singulate the dies and to expose at least a portion of the adhesive material in the gaps. The method then includes removing at least approximately all the adhesive material from the support member and/or the workpiece with a solvent.

9 Claims, 5 Drawing Sheets (51) Int. Cl.
*B32B 3/30* (2006.01)
*B32B 7/02* (2006.01)
*B32B 7/12* (2006.01)
*B32B 7/14* (2006.01)
*B32B 37/14* (2006.01)
*H05K 13/00* (2006.01)
*B23B 7/02* (2006.01)
*H01L 21/78* (2006.01)
*B32B 37/12* (2006.01)

(56) References Cited

U.S. PATENT DOCUMENTS

| | | | |
|---|---|---|---|
| 3,899,379 A | 8/1975 | Wanesky |
| 4,071,944 A | 2/1978 | Chuss et al. |
| 4,353,952 A | 10/1982 | Brown et al. |
| 4,921,564 A | 5/1990 | Moore |
| 5,170,930 A | 12/1992 | Dolbear et al. |
| 5,583,736 A | 12/1996 | Anderson et al. |
| 5,591,290 A | 1/1997 | Walter et al. |
| 5,656,552 A | 8/1997 | Hudak et al. |
| 5,809,987 A | 9/1998 | Wark et al. |
| 5,824,177 A | 10/1998 | Yoshihara et al. |
| 5,851,845 A | 12/1998 | Wood et al. |
| 5,866,953 A | 2/1999 | Akram et al. |
| 5,888,883 A | 3/1999 | Sasaki et al. |
| 5,891,753 A | 4/1999 | Akram |
| 5,898,224 A | 4/1999 | Akram |
| 5,933,713 A | 8/1999 | Farnworth |
| 5,946,553 A | 8/1999 | Wood et al. |
| 6,004,867 A | 12/1999 | Kim et al. |
| 6,008,070 A | 12/1999 | Farnworth |
| 6,020,624 A | 2/2000 | Wood et al. |
| 6,072,236 A | 6/2000 | Akram et al. |
| 6,124,634 A | 9/2000 | Akram et al. |
| 6,184,465 B1 | 2/2001 | Corisis |
| 6,187,615 B1 | 2/2001 | Kim et al. |
| 6,204,079 B1 | 3/2001 | Aspar et al. |
| 6,214,733 B1 | 4/2001 | Sickmiller |
| 6,217,655 B1 | 4/2001 | Kumar et al. |
| 6,228,687 B1 | 5/2001 | Akram et al. |
| 6,232,136 B1 | 5/2001 | Zavracky et al. |
| 6,235,552 B1 | 5/2001 | Kwon et al. |
| 6,310,288 B1 | 10/2001 | Moden |
| 6,320,266 B1 | 11/2001 | Hatchard |
| 6,326,697 B1 | 12/2001 | Farnworth |
| 6,326,698 B1 | 12/2001 | Akram |
| 6,338,980 B1 | 1/2002 | Satoh |
| 6,342,434 B1 | 1/2002 | Miyamoto et al. |
| 6,358,354 B1 | 3/2002 | Patil |
| 6,407,381 B1 | 6/2002 | Glenn et al. |
| 6,440,777 B2 | 8/2002 | Cobbley et al. |
| 6,503,780 B1 | 1/2003 | Glenn et al. |
| 6,505,395 B1 | 1/2003 | Farnworth et al. |
| 6,558,975 B2 | 5/2003 | Sugino et al. |
| 6,576,495 B1 | 6/2003 | Jiang et al. |
| 6,576,531 B2 | 6/2003 | Peng et al. |
| 6,642,126 B2 | 11/2003 | Igel |
| 6,661,104 B2 | 12/2003 | Jiang et al. |
| 6,670,008 B1 | 12/2003 | Ognissanti et al. |
| 6,673,649 B1 | 1/2004 | Hiatt et al. |
| 6,798,121 B2 | 9/2004 | Nakatani et al. |
| 6,842,217 B1 | 1/2005 | Miller et al. |
| 6,864,172 B2 | 3/2005 | Noma et al. |
| 6,869,894 B2 | 3/2005 | Moore |
| 6,896,760 B1 | 5/2005 | Connell et al. |
| 7,022,418 B2 | 4/2006 | Connell et al. |
| 7,037,751 B2 | 5/2006 | Connell et al. |
| 7,052,934 B2 | 5/2006 | Kurimoto et al. |
| 7,169,248 B1 | 1/2007 | Kirby et al. |
| 7,320,930 B2 | 1/2008 | Eshleman |
| 7,399,683 B2 | 7/2008 | Noma et al. |
| 8,361,604 B2 * | 1/2013 | Pratt et al. ............ 428/201 |
| 2002/0053735 A1 | 5/2002 | Neuhaus et al. |
| 2002/0185644 A1 | 12/2002 | Thallner |
| 2003/0209310 A1 | 11/2003 | Fuentes et al. |
| 2004/0242003 A1 | 12/2004 | Murayama |
| 2005/0176235 A1 | 8/2005 | Noma et al. |
| 2005/0176325 A1 | 8/2005 | Tokuda et al. |
| 2006/0046433 A1 | 3/2006 | Sterrett et al. |
| 2006/0159947 A1 | 7/2006 | Connell et al. |
| 2006/0162850 A1 | 7/2006 | Lake et al. |
| 2006/0172510 A1 | 8/2006 | Connell et al. |
| 2007/0036932 A1 | 2/2007 | Kirby et al. |
| 2007/0241078 A1 | 10/2007 | Pratt et al. |
| 2010/0247875 A1 | 9/2010 | Pratt et al. |

OTHER PUBLICATIONS

Sumitomo 3M Ltd., Product Description, H-WSS (Wafer Support System) for Ultra Thin Wafer Backgrinding, 2 pages, Sep. 1, 2003.

* cited by examiner

METHODS AND SYSTEMS FOR RELEASABLY ATTACHING SUPPORT MEMBERS TO MICROFEATURE WORKPIECES

CROSS-REFERENCE TO RELATED APPLICATIONS

This application is a continuation of U.S. application Ser. No. 12/795,474 filed Jun. 7, 2010, now U.S. Pat. No. 8,361,604, which is a divisional of U.S. application Ser. No. 11/374,750 filed Mar. 14, 2006, now U.S. Pat. No. 7,749,349, each of which is incorporated herein by reference in its entirety.

TECHNICAL FIELD

The present invention is related to methods and systems for releasably attaching support members to microfeature workpieces.

BACKGROUND

Existing microelectronic device packages typically include a microelectronic die attached to a support member, such as a printed circuit board. Bond-pads or other terminals on the die are electrically connected to corresponding terminals on the support member with solder balls, wire bonds, or other types of connectors. The die and the connectors can be protected by encapsulating the die to form a device package. The package can then be electrically connected to other microelectronic devices or circuits in many types of consumer or industrial electronic products.

Manufacturers are under continuous pressure to reduce the size of the electronic products. Accordingly, microelectronic die manufacturers seek to reduce the size of the packaged dies incorporated into the electronic products. The height of the packaged dies is often reduced by grinding the backside of the wafer to thin the dies before singulating the wafer and encapsulating the dies. One drawback with this approach, however, is that thin wafers are extremely fragile and therefore difficult to handle after backgrinding.

One approach for addressing this drawback is to attach a relatively thick wafer support to the wafer for the grinding process to ensure survival of the wafer as well as to facilitate subsequent handling of the wafer for further processing. One system, for example, includes attaching a wafer to a wafer support using a light-activated adhesive material. The wafer support is removed after the wafer is processed and the resulting thin wafer is ready for further processing and/or packaging. This system, however, has several drawbacks. One drawback with this system is that subsequent processing steps using lasers or deep UV light may weaken the bond of the light-activated adhesive. As a result, the wafer may become unstable and/or completely break away from the wafer support. Another drawback with this system is that the processing equipment is proprietary and relatively expensive.

Because of the problems with the light-activated adhesive described above, a variety of other adhesives have been used to attach the wafer to the wafer support. These additional types of adhesives, however, also include a number of drawbacks. One drawback with many adhesive materials, for example, is that it can be difficult to remove the adhesive from the wafer after processing. The removal process, for example, may require heat and/or solvents. Accordingly, the wafer can be vulnerable to damage and/or breakage during removal of the adhesive material. For example, solvents can effectively remove the adhesive materials if applied to appropriate areas of the wafer. It can be difficult, however, to control application of the solvent materials and the solvents may contact sensitive portions of the individual dies and damage and/or contaminate the dies. Thus, there is a need to improve the handling of microfeature workpieces during processing.

BRIEF DESCRIPTION OF THE DRAWINGS

FIGS. 1A-7 illustrate various stages of a method for releasably attaching a support member to a microfeature workpiece in accordance with an embodiment of the invention.

DETAILED DESCRIPTION

A. Overview

The present invention is directed toward methods and systems for releasably attaching support members to microfeature workpieces with one or more microelectronic dies. One particular embodiment of such a method comprises forming discrete blocks of material at a first side of a support member in a predetermined pattern. The method also includes depositing an adhesive material into gaps between the individual blocks of material and placing a first side of the workpiece in contact with the adhesive material and/or the blocks. The method further includes cutting through a second side of the workpiece to singulate the dies and to expose at least a portion of the adhesive material in the gaps. The method then includes removing at least approximately all the adhesive material from the support member and/or the workpiece with a solvent. In several embodiments, the method can further include removing material from a second side of the workpiece to thin the workpiece before cutting through the second side of the workpiece to expose at least a portion of the adhesive material.

Another embodiment of a method for processing a microfeature workpiece comprises forming a plurality of stand-offs at a first side of a support member. The individual stand-offs are arranged in a pattern on the support member generally corresponding to a pattern of microelectronic dies on the workpiece. The method also includes depositing an adhesive material into a plurality of gaps between the individual stand-offs on the support member. The method further includes placing a first side of the workpiece in contact with the adhesive material and/or the stand-offs and removing material from a second side of the workpiece to thin the workpiece. The method then includes cutting through the second side of the workpiece to singulate the dies and expose at least a portion of the adhesive material in the gaps while the workpiece is in contact with the adhesive material and/or the stand-offs. The method also includes removing at least approximately all the adhesive material from the support member and/or the workpiece with a solvent while the workpiece is at least partially in contact with the stand-offs.

Additional embodiments of the invention are directed toward microfeature assemblies. One embodiment of such an assembly includes a microfeature workpiece having a first side, a second side opposite the first side, and a plurality of microelectronic dies at the first side. The individual dies are arranged on the workpiece in a predetermined pattern. The assembly also includes a temporary support member positioned proximate to the first side of the workpiece. The support member includes a plurality of discrete blocks of material separated by a plurality of gaps. The blocks are arranged on the support member in a pattern corresponding at least in part to the pattern of dies on the workpiece. The assembly further includes adhesive material disposed in the gaps between the individual blocks of material on the support member and in contact with portions of the first side of the workpiece.

The term "microfeature workpiece" is used throughout to include substrates upon which and/or in which microelectronic circuits or components, data storage elements or layers, vias or conductive lines, micro-optic features, micromechanical features, and/or microbiological features are or can be fabricated using microlithographic techniques. The term "microfeature assembly" is used throughout to include a variety of articles of manufacture, including, e.g., semiconductor wafers having active components, individual integrated circuit dies, packaged dies, and subassemblies comprising two or more microelectronic workpieces or components, e.g., a stacked die package. Many specific details of certain embodiments of the invention are set forth in the following description and in FIGS. 1A-8B to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

B. Embodiments of Methods for Releasably Attaching Support Members to Microfeature Workpieces FIGS. 1A-7 illustrate various stages of a method for releasably attaching a support member to a microfeature workpiece. More specifically, FIGS. 1A-7 illustrate stages of a method for releasably attaching a front side of a workpiece including a plurality of microelectronic dies to a support member using an adhesive disposed only in gaps between a plurality of support blocks or stand-offs on the support member. After processing, the backside of the workpiece is diced or cut to singulate the dies and expose at least a portion of the adhesive such that the adhesive can be removed with a solvent that does not contaminate and/or damage the components of the workpiece.

Figure 1A:
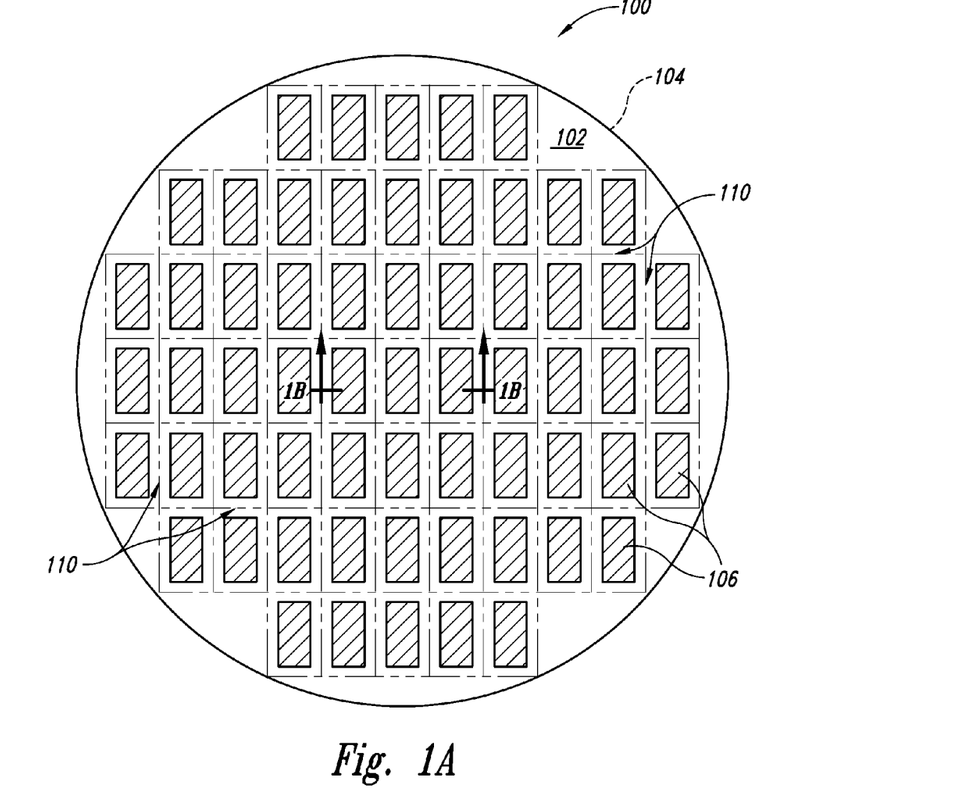
Figure 1B:
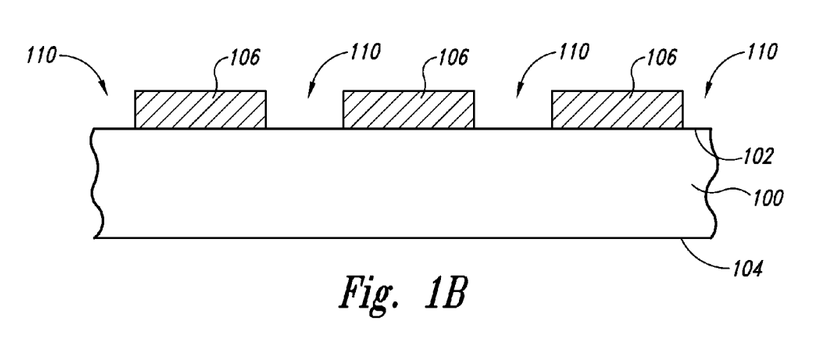

FIG. 1A is a top plan view of a temporary support member or carrier 100 at an initial stage before a microfeature workpiece (not shown—described in detail below with respect to FIG. 3) has been attached to the support member 100, and FIG. 1B is a side cross-sectional view taken substantially along line 1B-1B of FIG. 1A. Referring to FIGS. 1A and 1B together, the support member 100 includes a front side 102 and a back side 104 facing opposite the front side 102. The support member 100 can be sized and shaped to receive the workpiece and provide support to the workpiece during subsequent processing steps to prevent the workpiece from breaking and/or excessively warping. In one embodiment, the support member 100 is generally rigid and has a planform shape at least approximately identical to that of the workpiece. In other embodiments, however, the support member 100 can have a different planform shape than the workpiece. The support member 100 can include a glass substrate, a silicon substrate, or a substrate formed from another suitable material. In several embodiments, the coefficient of thermal expansion (CTE) of the support member can be at least generally similar to the CTE of the workpiece to help prevent excessive warping and/or undesirable relative movement between the support member 100 and the workpiece during thermal processing.

The support member 100 includes a plurality of support blocks or stand-offs 106 arranged in an array on the support member 100. As shown in FIG. 1A, the support blocks 106 can be formed on the support member 100 with a dimension and a pattern generally corresponding to an arrangement of microelectronic dies (i.e., a die pattern) on the workpiece. The individual support blocks 106 also include dimensions generally corresponding to the dimensions of the individual dies on the workpiece. As such, the individual support blocks 106 are separated from each other by a plurality of gaps or channels 110. The gaps 110 are arranged on the support member 100 to generally match a pattern of so-called streets or scribe lines between the dies on the workpiece.

The support blocks 106 can include a silicon material, an epoxy material, a polymer material, or another suitable material. In several embodiments, the support block material may be cured after application so that the material is generally non-adhesive, but still has a slightly "tacky" nature. In other embodiments, however, the material may not be cured. The support block material can be deposited onto the front side 102 of the support member 100 using a screen printing process, a dispense process, a pre-patterned film process (e.g., a layer of film over all or substantially all the front side 102 of the support member 100 with removable, cut-out portions corresponding to the gaps 110), a molding process, or another suitable process known to those of ordinary skill in the art. In other embodiments described below with respect to FIGS. 8A and 8B, the support blocks can be integral components of the support member formed using a suitable etching and/or grinding process.

Figure 2A:
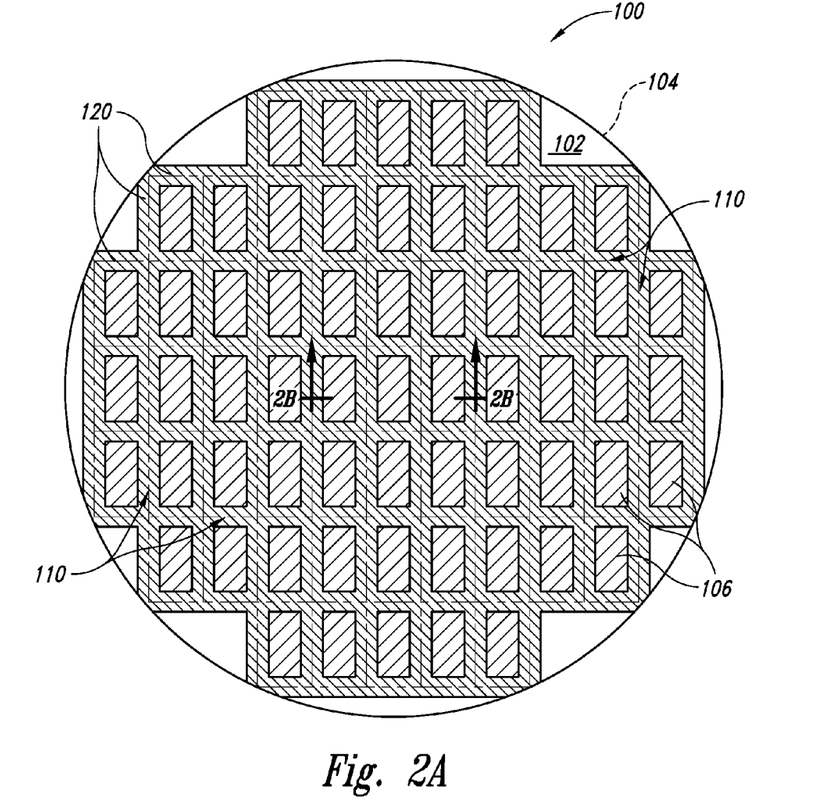
Figure 2B:
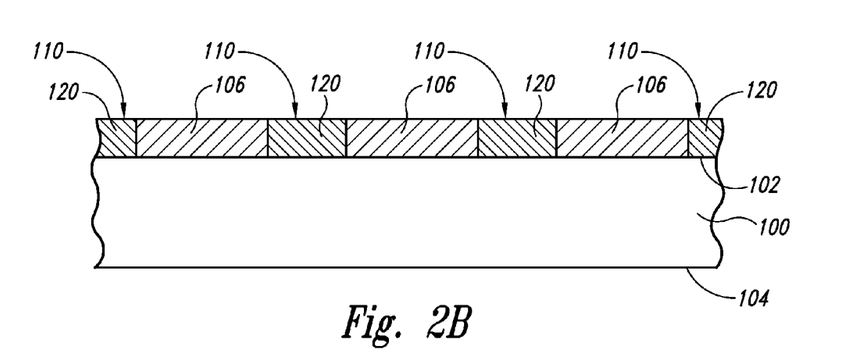

FIG. 2A is a top plan view of the support member 100 after an adhesive material 120 has been deposited onto the support member 100, and FIG. 2B is a side cross-sectional view taken substantially along line 2B-2B of FIG. 2A. Referring to FIGS. 2A and 2B together, the adhesive material 120 is deposited into the gaps 110 between the individual support blocks 106 to at least substantially fill the gaps 110. The adhesive material 120 can include GenTak™, commercially available from General Chemical Corporation of Parsippany, N.J., or other suitable materials. The adhesive material 120 can be deposited into the gaps 110 using a pen- or nozzle-type dispensing process, a screen printing process, a squeegee process, a tape dispensing process, a pre-patterned film process (e.g., a layer of film over all or substantially all the front side 102 of the support member 100 with removable, cut-out portions corresponding to the gaps 110), or another suitable process.

Figure 3:
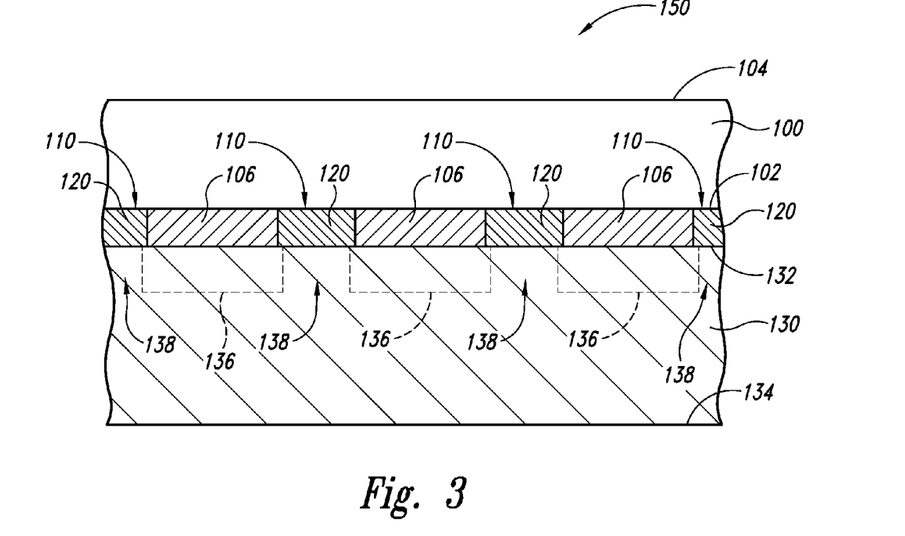

FIG. 3 is a side cross-sectional view of the support member 100 after a microfeature workpiece 130 has been attached to the support member to form a microfeature assembly 150. The workpiece 130 includes a front side 132, a back side 134 opposite the front side 132, and a plurality of microelectronic dies 136 (shown in broken lines) arranged in a die pattern at the front side 132 of the workpiece 130. The individual dies 136 are separated from each other by a plurality of streets or scribe lines 138. The workpiece 130 is generally positioned relative to the support member 100 such that the front side 132 of the workpiece 130 faces toward the front side 102 of the support member 100. The individual support blocks 106 contact at least a portion of the corresponding individual dies 136 at the front side 132 of the workpiece 130, and the streets 138 between the individual dies 136 are generally aligned with the gaps 110.

Figure 4:
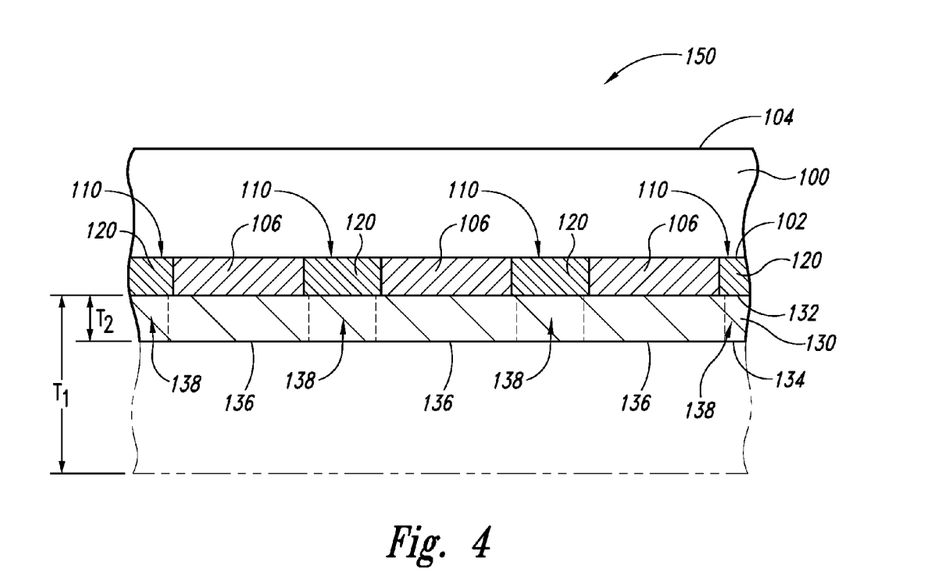

After the workpiece 130 has been attached to the support member 100, the workpiece 130 is ready for additional processing. In one embodiment, the additional processing can include removing material from the back side 134 of the workpiece 130 to reduce its thickness. FIG. 4, for example, is a side cross-sectional view of the assembly 150 after the workpiece 130 has been thinned. More specifically, the workpiece 130 has been thinned from a first thickness $T_1$ (shown in broken lines) to a second thickness $T_2$ less than the first thickness $T_1$. In one embodiment, the material can be removed from the workpiece 130 by grinding and/or etching. In other embodiments, the material can be removed from the back side 134 of the workpiece 130 using other suitable processes. In any of these embodiments, the support member 100 supports the workpiece 130 to prevent it from breaking and/or excessively warping during processing. In one aspect of these embodiments, the thickness of the assembly 150 after the workpiece 130 has been thinned may be slightly greater than that of a conventional microfeature workpiece, but the overall size and shape of the assembly 150 can be generally the same size and shape as conventional microfeature workpieces. Accordingly, the equipment and steps used to process the workpiece 130 with the support member 100 attached can be similar to or identical to the equipment and steps used to process existing microfeature workpieces.

Figure 5:
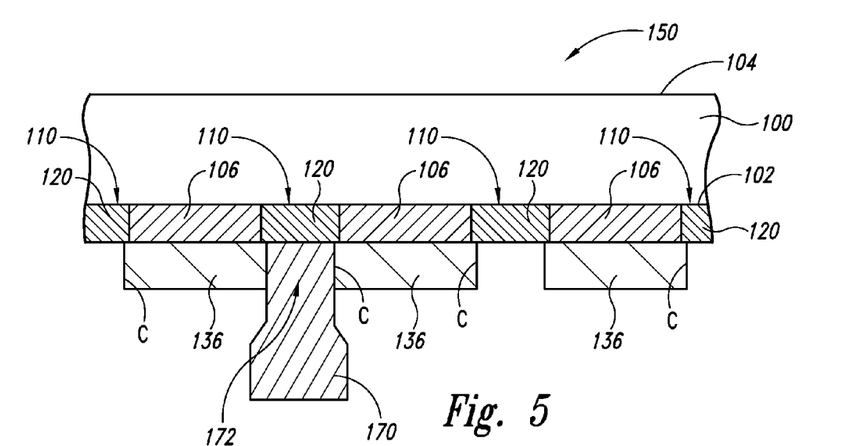

Referring next to FIG. 5, the workpiece 130 can be diced, cut, or otherwise separated to (a) singulate the individual microelectronic dies 136, and (b) expose at least a portion of the adhesive material 120 within the gaps 110. In one embodiment, for example, a wafer saw 170 can be used to form incisions C through the workpiece 130 and, in at least some cases, at least a portion of the adhesive material 120. In this way, at least a portion of the adhesive material 120 in each gap 110 is exposed to an external environment.

In one aspect of this embodiment, the wafer saw 170 includes a blade 172 having a width W corresponding at least in part to the width of the gaps 110 and/or the width of the adhesive material 120 disposed between the blocks 106. In the illustrated embodiment, for example, the width W of the blade 172 is just slightly less than the width of the gaps 110 so that all or at least substantially all the adhesive material 120 is exposed. In other embodiments, however, the blade 172 may be narrower than the width of the gaps 110 so long as the width of the incision C is sufficient to allow a solvent to pass through the incision C and contact the adhesive material 120.

Figure 6:
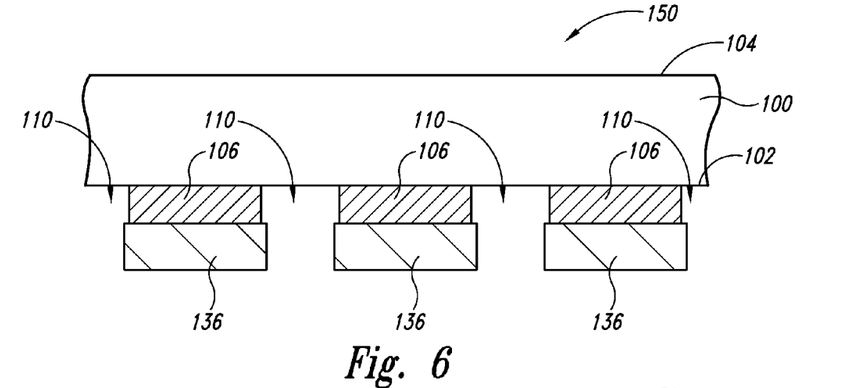

Referring next to FIG. 6, the adhesive material 120 (FIG. 5) can be removed from the assembly 150 with a solvent or dissolving agent (not shown). In one embodiment, for example, at least a portion of the assembly 150 can be soaked in the solvent until the adhesive material is dissolved or otherwise removed from the assembly. In other embodiments, the solvent can be applied or deposited onto the exposed adhesive material 120 using other suitable methods. The solvent can include GenSolve™, commercially available from General Chemical, or another suitable solvent or dissolving agent that will remove all or at least substantially all the adhesive material without negatively affecting or contaminating the other components of the assembly 150.

In one particular aspect of this embodiment, the slightly tacky or adhesive nature of the material used to form the support blocks 106 (e.g., silicon) helps keep the individual dies 136 in place during removal of the adhesive material and subsequent processing. This is due, at least in part, to the natural affinity between the silicon material of the support blocks 106 and the silicon material of the dies 136. In other embodiments, other methods can be used to releasably hold the dies 136 to the support blocks 106 during removal of the adhesive material 120 (FIG. 5). In one embodiment, for example, a die adhesive material can be applied to the support blocks 106 before the workpiece 130 is attached to the support member 100 as described in detail above with respect to FIG. 3.

Figure 7:
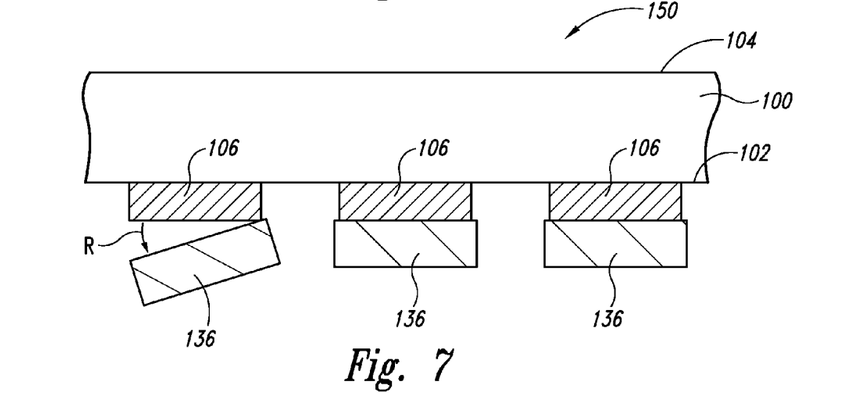

Referring now to FIG. 7, the individual dies 136 can be removed from the assembly 150 (as shown by the arrow R) using a conventional pick-and-place apparatus (not shown) or another suitable method. In several embodiments, the support member 100 can be cleaned after removing the dies 136 using a suitable cleaning process, and the support member 100 can be reused to process additional workpieces.

One feature of the method described above with respect to FIGS. 1A-7 is that the adhesive material 120 is applied only within the gaps 110 between the support blocks 106. One advantage of this feature is that significantly less adhesive is required as compared with conventional methods that coat the entire surface of the support member and/or workpiece with an adhesive. Furthermore, less solvent and less time are necessary to remove the adhesive material 120 from the assembly 150 compared to conventional adhesive configurations.

Another feature of the method described above with respect to FIGS. 1A-7 is that all or at least approximately all the adhesive material 120 is generally exposed to an external environment after cutting the workpiece 130 to singulate the dies 136. An advantage of this feature is that the solvent can directly contact a substantial portion of the adhesive material 120 and, accordingly, significantly decrease the diffusion time as compared with conventional methods where the solvent only contacts a small portion of the adhesive material (e.g., if only the perimeter portion around the outside of the wafer is exposed). The various components of the dies 136 are accordingly less likely to be contaminated and/or damaged as compared to conventional processes that require heat, significant volumes of solvents, and/or various other time-consuming processes to remove the adhesive material 120 from the assembly 150.

Still another feature of embodiments of the method described above is that the support member 100 is releasably attached to the front side 132 of the workpiece 130 over all or approximately all the dies 136 of the workpiece 130. An advantage of this feature is that the various components of the dies 136 are less likely to be damaged as the workpiece 130 is processed because the support member 100 provides support and protection. For example, the support member 100 can shield the dies 136 from incidental contact with surrounding tools, machinery, and/or other components.

Still yet another feature of embodiments of the method described above with reference to FIGS. 1A-7 is that the support member 100 can remain attached to the workpiece 130 as the workpiece is thinned and singulated. An advantage of this feature is that the workpiece 130 can be less likely to be damaged or broken as it is transferred from a grinder or other tool to other machinery for additional processing and singulation. The support member 100 can also provide a generally rigid support structure that reduces the likelihood for the workpiece 130 to bend or warp during such additional processing.

Figure 8A:
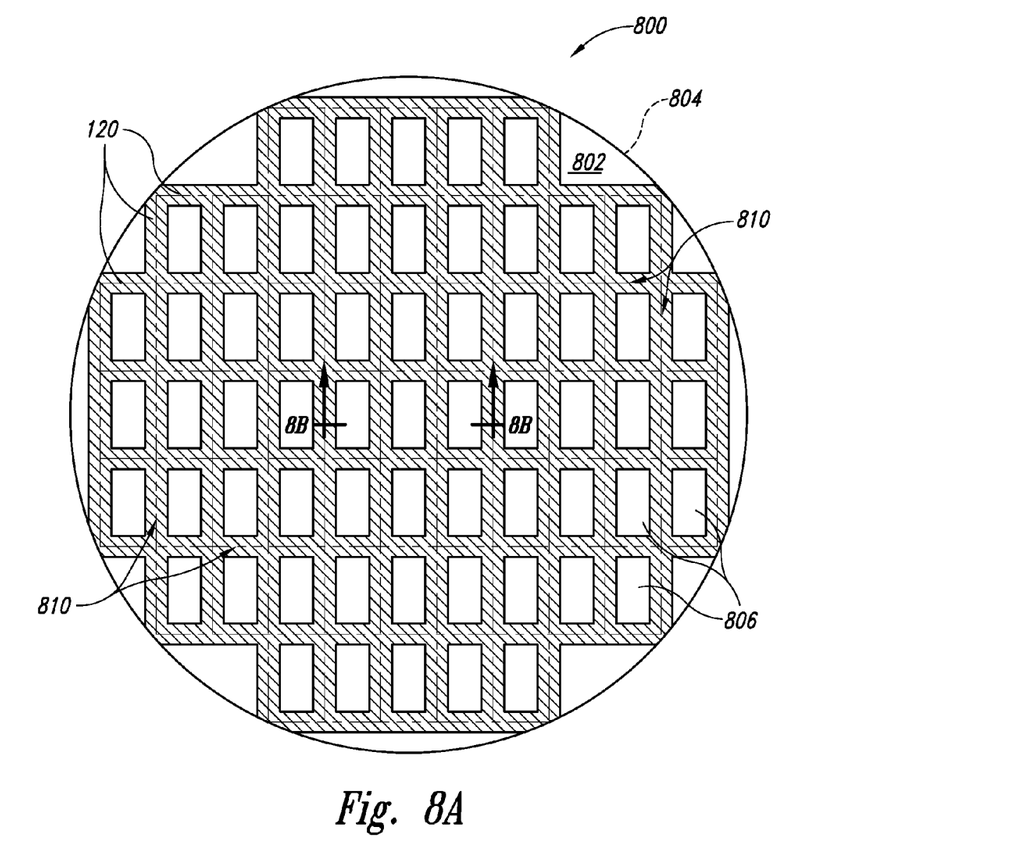
FIGS. 8A and 8B illustrate a stage in a method for releasably attaching a support member to a microfeature workpiece in accordance with another embodiment of the invention.
Figure 8B:
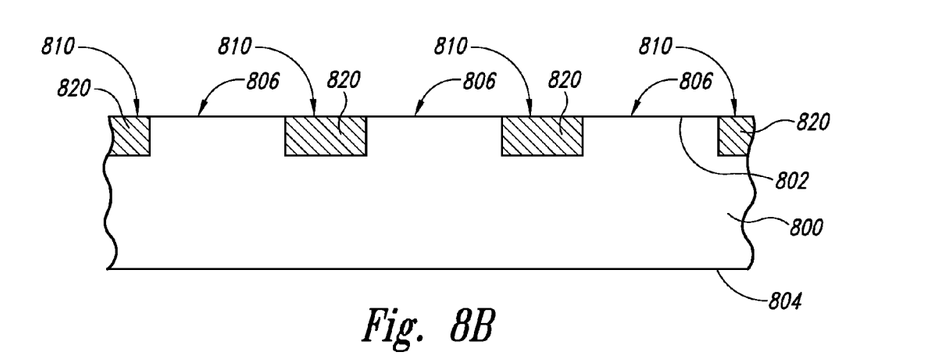

C. Additional Embodiments of Methods for Releasably Attaching Support Members to Microfeature Workpieces FIGS. 8A and 8B illustrate a stage in a method of releasably attaching a support member to a microfeature workpiece in accordance with another embodiment of the invention. More particularly, FIG. 8A is a top plan view of a temporary support member or carrier 800 at an initial stage before a microfeature workpiece (not shown) has been attached to the support member 800, and FIG. 8B is a side cross-sectional view taken substantially along line 8B-8B of FIG. 8A. This stage of this method differs from the stage described above with respect to FIGS. 1A and 1B in that the support member 800 has a different configuration than the support member 100.

Referring to FIGS. 8A and 8B together, for example, the support member 800 includes a front side 802 and a back side 804 facing opposite the front side 802. The support member 800 further includes a plurality of support blocks or stand-offs 806 at the front side 802 of the support member 800. In this embodiment, the support blocks 806 are integral components of the support member 800 such that the resulting blocks 806 and support member 800 are a single, unitary component formed from the same material rather than the support blocks being separate components attached to and/or formed on the support member as described previously. The support blocks 806 can be formed at the front side 802 of the support member 800 using an etching process, a grinding process, an additive process, or another suitable method. The dimensions and arrangement of the support blocks 806 can be generally similar to the configuration of the support blocks 106 on the support member 100. For example, the individual support blocks 806 can be separated from each other by gaps or channels 810, and the adhesive material 820 can be deposited into the gaps 810. After forming the support blocks 806, the support member 800 can be used in subsequent processing steps that are at least generally similar to those described above with respect to FIGS. 2A-7.

From the foregoing, it will be appreciated that specific embodiments of the invention have been described herein for purposes of illustration, but that various modifications may be made without deviating from the invention. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. An assembly, comprising:
   a temporary carrier having a plurality of support blocks separated from each other by a plurality of gaps, the individual support blocks having a first side facing toward a microfeature workpiece, a second side opposite from the first side and facing toward the carrier, and side walls extending between the first and the second sides, the support blocks being arranged on a first side of the carrier in a pattern generally corresponding to a die pattern of the microfeature workpiece such that the individual support blocks face corresponding individual dies on the workpiece, wherein a first adhesion of the first side of the support blocks is less than a second adhesion of the second side of the support blocks; and
   adhesive material disposed in the gaps between the individual support blocks, wherein the adhesive material in the gaps is in contact with portions of the first side of the carrier and the side walls of the support blocks, wherein the first side of the support blocks and an upper surface of the adhesive material in the gaps between the individual support blocks are generally co-planar.

2. The assembly of claim 1, further comprising the microfeature workpiece in contact with the first side of the support blocks.

3. The assembly of claim 2 wherein the microfeature workpiece is singulated into individual dies.

4. The assembly of claim 1 wherein the first side of individual support blocks is smaller than the corresponding die on the microfeature workpiece.

5. The assembly of claim 1 wherein the first sides of the support blocks are generally free of adhesive material.

6. The assembly of claim 1 wherein the support blocks are cured.

7. The assembly of claim 1 wherein the support blocks are at least partially tacky.

8. The assembly of claim 1 wherein the support blocks are discrete blocks of material.

9. The assembly of claim 2 wherein the adhesive material is at least partially contacting active side of individual dies.

* * * * *